(12) United States Patent
Liu et al.

(10) Patent No.: US 11,189,453 B2
(45) Date of Patent: *Nov. 30, 2021

(54) ELECTRON SOURCE AND ELECTRON GUN (71) Applicant: 38th Research Institute, China Electronics Technology Group Corporation, Anhui (CN)

(72) Inventors: Huarong Liu, Anhui (CN); Junting Wang, Anhui (CN); Xuehui Wang, Anhui (CN); Yuxuan Qi, Anhui (CN); Xianbin Hu, Anhui (CN); Xueming Jin, Anhui (CN); Zhao Huang, Anhui (CN); Dizhi Chen, Anhui (CN); Yijing Li, Anhui (CN); Youyin Deng, Anhui (CN)

(73) Assignee: 38th Research Institute, China Electronics Technology Group Corporation, Anhui (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/966,907

(22) PCT Filed: Dec. 26, 2018

(86) PCT No.: PCT/CN2018/123951
§ 371 (c)(1),
(2) Date: Aug. 3, 2020

(87) PCT Pub. No.: WO2020/073506
PCT Pub. Date: Apr. 16, 2020

(65) Prior Publication Data
US 2021/0050175 A1 Feb. 18, 2021

(30) Foreign Application Priority Data

Oct. 12, 2018 (CN) .......................... 201811190768.4

(51) Int. Cl.
*H01J 37/073* (2006.01)
*H01J 3/02* (2006.01)
(Continued)

(52) U.S. Cl.
CPC ............ *H01J 37/073* (2013.01); *H01J 3/021* (2013.01); *H01J 37/065* (2013.01); *H01J 37/07* (2013.01); *H01J 2237/002* (2013.01)

(58) Field of Classification Search
CPC ........ H01J 37/07; H01J 37/073; H01J 37/065; H01J 2237/002; H01J 3/021
See application file for complete search history.

(56) References Cited

U.S. PATENT DOCUMENTS 5,302,238 A * 4/1994 Roe .................. H01J 9/025
216/11
5,883,467 A * 3/1999 Chalamala ............. H01J 29/94
313/553
(Continued)

FOREIGN PATENT DOCUMENTS

CN 101653735 A 2/2010
EP 2546862 A1 1/2013
(Continued)

OTHER PUBLICATIONS

International Search Report (English translation) and Written Opinion; International Application No. PCT/CN2018/123951, dated Jul. 3, 2019, 5 pp.
(Continued)

*Primary Examiner* — David E Smith
(74) *Attorney, Agent, or Firm* — Myers Bigel, P.A.

(57) ABSTRACT

The present disclosure provides an electron source, including one or more tips, wherein at least one of the tips comprises one or more fixed emission sites, wherein at least one of the tips includes one or more fixed emission sites,
(Continued)

wherein the emission sites includes a reaction product of metal atoms on a surface of the tip with gas molecules.

17 Claims, 6 Drawing Sheets

(51) Int. Cl.
*H01J 37/065* (2006.01)
*H01J 37/07* (2006.01)

(56) References Cited

U.S. PATENT DOCUMENTS

| | | | |
|---|---|---|---|
| 6,281,626 B1* | 8/2001 | Nakamura | H01J 1/30 313/491 |
| 6,573,642 B1* | 6/2003 | VonAllmen | H01J 1/3044 313/309 |
| 7,215,072 B2* | 5/2007 | Koga | H01J 1/3044 313/309 |
| 7,588,475 B2 | 9/2009 | Koga et al. | |
| 8,070,929 B2 | 12/2011 | Kim et al. | |
| 8,766,542 B2 | 7/2014 | Cho et al. | |
| 9,023,226 B2 | 5/2015 | Liu et al. | |
| 9,524,848 B2 | 12/2016 | Hirsch | |
| 2003/0155522 A1* | 8/2003 | Ooae | B82Y 10/00 250/423 R |
| 2004/0189176 A1* | 9/2004 | Koga | H01J 9/025 313/311 |
| 2007/0184747 A1 | 8/2007 | Koga et al. | |
| 2010/0006447 A1* | 1/2010 | Winkler | H01J 1/3044 205/205 |
| 2010/0048391 A1 | 2/2010 | Kim et al. | |
| 2013/0200788 A1 | 8/2013 | Cho et al. | |
| 2014/0077684 A1* | 3/2014 | Liu | H01J 37/08 313/310 |
| 2015/0002009 A1* | 1/2015 | Zhang | H01J 9/025 313/46 |
| 2015/0054398 A1* | 2/2015 | Yan | C23C 16/40 313/341 |
| 2015/0123010 A1 | 5/2015 | Hirsch | |

FOREIGN PATENT DOCUMENTS

| | | |
|---|---|---|
| JP | S5912533 A | 1/1984 |
| JP | 2003100244 A | 4/2003 |
| JP | 2011171088 A | 9/2011 |
| JP | 5551830 B2 | 5/2014 |
| TW | I362050 B | 4/2012 |

OTHER PUBLICATIONS

"Communication with Supplementary European Search Report", European Patent Application No. 18936834.3, dated Mar. 25, 2021, 12 pp.

Martin, E.E., et al., "Stable, High Density Field Emission Cold Cathode", Journal of Applied Physics, vol. 31, No. 5, May 1960, pp. 782-789.

Yeong, K.S., et al., "Life cycle of a tungsten cold field emitter", Journal of Applied Physics, vol. 99, No. 10, May 2006, pp. 104903-1-104903-6.

"Notice of Reasons for Refusal and English language translation", JP Application No. 2020-542131, dated Jun. 28, 2021, 6 pp.

\* cited by examiner

ELECTRON SOURCE AND ELECTRON GUN

CROSS-REFERENCE TO RELATED APPLICATIONS

This application is a Section 371 National Stage Application of International Application No. PCT/CN2018/123951, filed on Dec. 26, 2018, entitled "ELECTRON SOURCE AND ELECTRON GUN", which claims priority to Chinese Patent Application No. 201811190768.4 filed on Oct. 12, 2018 with CNIPA, incorporated herein by reference in entirety.

TECHNICAL FIELD

The present disclosure relates to the field of electron source technology, and in particular, to a field emission electron source and a field emission electron gun.

BACKGROUND

Free electrons in metal may be emitted under certain conditions. If a cathode is made of metal and made into a very fine tip and it is applied by a voltage of thousands of volts in a vacuum, then the electrons in the metal may be emitted from the cathode cold metal. This method of emitting electrons is called as field emission, belonging to cold cathode emission.

For the electron source, the most important parameter is brightness, which directly determines the beam quality. At an extraction voltage of V0, the brightness may be denoted in formula (1):

$$B = \frac{I}{S \times \Omega} \propto \frac{I}{d^2 \times \alpha^2} \qquad (1)$$

Where B refers to the brightness, I refers to an emission current, S refers to an equivalent emission area, d refers to an equivalent diameter, $\Omega$ refers to a solid angle, and $\alpha$ refers to an half opening angle. Further, the brightness B is proportional to an acceleration voltage $V_a$, as shown in the formula (2).

$$B \propto V_a \qquad (2)$$

As can be seen from the formula (1), in order to obtain a high brightness, it is necessary to increase I and reduce a and d as much as possible. Moreover, the lower the extraction voltage V0 is required to obtain a certain emission current, the better it is, which requires that an emission surface of the tip has a lower work function and a sharper head structure. In addition, another key parameter of the electron source is monochromaticity, which can be expressed by an energy spread SE.

Based on the above, the most ideal electron source is the cold field emission electron source (abbreviated as CFE). The brightness of CFE is higher than that of other types of electron sources by about one order of magnitude, and it has a small energy spread (~0.3 eV). In addition, in order to seek for the extreme diameter as far as possible, atomic-scale electron sources having a low work function recently have become the research hotspots, that is, the emission site consists of only one or several atoms.

In the process of implementing the concept of the present disclosure, the inventors have found that the CFE in the prior art has at least the following disadvantages: firstly, the stability of the CFE is often poor, and it is required to work under extremely high vacuum ($10^{-9}$~$10^{-8}$ Pa), which severely limits the scope of application thereof. Even in such an environment, it needs to be processed regularly to obtain a more stable working state. Secondly, due to the impact of ion bombardment, the CFE is easier to be burned out. Thirdly, the aforementioned disadvantages become more serious at a larger emission current, the current CFE generally needs a total emission current of ~10 microamperes for stable operation for a long time, and the utilization rate thereof is very low. In view of the aforementioned drawbacks, the Schottky thermal-field emission source is dominant in the field of high-brightness electron sources.

SUMMARY

In view of the above, the present disclosure provides a stable electron source and electron gun which have a large field emission current and can operate at a relatively poor vacuum degree.

According to an aspect of the present disclosure, there is provided an electron source, comprising one or more tips, wherein at least one of the tips comprises one or more fixed emission sites, wherein the emission sites comprises a reaction product of metal atoms on a surface of the tip with gas molecules. Since the emission site is a reaction product of metal atoms fixed on the surface of the tip with gas molecules, it is rooted in the surface of the tip, rather than gas molecules, dissociative particles or the like that are dissociative on the surface of the tip. It would not incur over-current burnout due to that the dissociative emission sites gather together to form a new emission site, thereby effectively improving stability. Moreover, the emission site comprises the reaction product of the metal atoms on the surface of the tip with the gas molecules, in comparison with metal atoms or other metal compounds (such as metal boride or the like), it has higher stability in the working environment (with the presence of gas molecules), for example, being less likely to interact or react with, for example, hydrogen in the working environment, further improving the stability of the electron source. In addition, the emission site of the electron source provided by the present disclosure may be a reaction product of one or several metal atoms with gas molecules, that is, an atomic-scale electron source having a low work function may be formed. Further, the reaction product significantly reduces the surface work function, and the formation of the pointed cone of the surface emission site also significantly increases the emission capability. Still further, the current value of the field emission current may be increased by increasing the number of the emission sites. In this way, it is possible to form a stable electron source with a large field emission current.

According to an embodiment of the present disclosure, the emission sites comprise a reaction product of the metal atoms with the gas molecules under an electric field. This facilitates the formation of the emission site at a designated position of the tip, particularly at a position where it has an electric field advantage, for example, at a protrusion of the tip.

According to an embodiment of the present disclosure, in a specific example, at least one of the tips comprises a base and one or more high field strength structures on the base having a higher field strength than that of other portions of the base, and an outer surface of at least one of the high field strength structures comprises metal atoms. The metal atoms on the surface of the high field strength structure are more likely to react with the gas molecules to form a reaction product in the same environment by virtue of the field strength advantage, so as to preferentially generate the emission site on the high field strength structure. In another specific example, at least one of the tips comprises a base and one or more active regions on the base having a larger reaction activity than that of other portions of the base, and an outer surface of at least one of the active regions comprises metal atoms. The metal atoms on the surface of the active region are more likely to react with the gas molecules to form a reaction product in the same environment by virtue of the activity advantage, so as to preferentially generate the emission site at the active region. In still another specific example, at least one of the tips comprises a base and one or more high field strength structures on the base having a higher field strength than that of other portions of the base, at least a portion of surfaces of the high field strength structures are active regions having a larger reaction activity, and outer surfaces of the active regions comprise metal atoms. The metal atoms on the surface of the active region are more likely to react with the gas molecules to form a reaction product in the same environment by virtue of the field strength advantage and the activity advantage, so as to preferentially generate the emission site at the active region.

According to an embodiment of the present disclosure, the electric field is generated by applying a positive bias, a negative bias, or a combination of a positive bias and a negative bias; for applying a positive bias, a strength of the electric field comprises 1 to 50 V/nm; for applying a negative bias, a strength of the electric field comprises 1 to 30 V/nm. This can avoid the atoms on the surface of the tip from evaporating, and can avoid the tip from being burnt out due to overcurrent during the formation of the emission site.

According to an embodiment of the present disclosure, the high field strength structure comprises a protrusion.

According to an embodiment of the present disclosure, the protrusion has a size in an order of sub-nanometers to 100 nanometers.

According to an embodiment of the present disclosure, the protrusion is formed by any one or more of the following methods: thermal annealing, application of electric field, thermal-field treatment, etching, and nano-machining or by a method of, for example, forming a protrusion by plating a layer of metal atoms on a single crystal metal tip followed by thermal annealing.

According to an embodiment of the present disclosure, for a tip comprising a protrusion, metal atoms on at least a portion of a surface of the protrusion have the same or larger reaction activity than that of other portions of the surface of the base in a reaction with gas molecules under a vacuum condition, that is, at least a portion of the surface of the protrusion (such as a designated region) has metal atoms having a larger reaction activity than other regions. For a tip comprising no protrusion, metal atoms on a surface of the active region of the base have larger reaction activity than that of other portions of the surface of the base in a reaction with gas molecules under a vacuum condition.

According to an embodiment of the present disclosure, the base is made of an electrically conductive material; and/or, the high field strength structure is made of an electrically conductive material; and/or, the base and/or the high field strength structure has metal atoms on surfaces thereof; and/or, the high field strength structure is made of a same or different material from the base; and/or, a material of the metal atoms on surfaces of the base and/or the high field strength structure is the same as or different from a material of the high field strength structure, and if they are different from each other, the metal atoms on the surfaces of the base and/or the high field strength structure are formed by an evaporation process or an electroplating process; and/or, a material of the metal atoms on surfaces of the base and/or the high field strength structure is the same as or different from a material of the base, and if they are different, the metal atoms on the surfaces of the base and/or the high field strength structure are formed by an evaporation process or an electroplating process.

According to an embodiment of the present disclosure, the gas molecules are introduced gas molecules and/or gas molecules remaining in a vacuum environment, the gas molecules comprise hydrogen-containing gas molecules, and any one or more kinds of the following gas molecules: nitrogen-containing gas molecules, carbon-containing gas molecules, or oxygen-containing gas molecules.

According to an embodiment of the present disclosure, the hydrogen-containing gas molecules comprise hydrogen gas.

According to an embodiment of the present disclosure, a disappearance temperature of the emission site is lower than a smallest value of disappearance temperatures of the base, the high field strength structure, and the metal atoms, and the disappearance temperature of the emission site is higher than an operating temperature of the electron source; or, a disappearance temperature of the emission site is lower than a smallest value of disappearance temperatures of the base, the high field strength structure, and the metal atoms, and the disappearance temperature of the emission site is higher than a larger value of an operating temperature of the electron source and a desorption temperature of the gas molecules adsorbed on any of the tips. In this way, it facilitates desorption, repair, and the like by heat treatment, to prolong the working life.

According to an embodiment of the present disclosure, the base is made of an electrically conductive material having a melting point above 1000K; and/or, the high field strength structure is made of an electrically conductive material having a melting point above 1000K; and/or, a material of the metal atoms on surfaces of the base and/or the high field strength structure is a metal material having a melting point above 1000K; and the reaction product of the metal atoms with the gas molecules comprises a reaction product of metal atoms having a melting point above 1000K with gas molecules under a vacuum condition. The tip preferably adopts an electrically conductive material having a melting point above 1000K, which is more stable and facilitates cleaning of the tip by the heat treatment method or the like, as described above.

According to an embodiment of the present disclosure, the metal material comprises any one or more of the following: tungsten, iridium, tantalum, molybdenum, niobium, hafnium, chromium, vanadium, zirconium, titanium, rhenium, palladium, platinum, rhodium, osmium, platinum, ruthenium, gold, metal-hexaboride and other metal materials having a melting point higher than 1000K.

According to an embodiment of the present disclosure, the metal material is tungsten; and the emission site comprises a hydrogen tungsten compound.

According to an embodiment of the present disclosure, a dimension of an opening angle of an electron beam is adjusted by adjusting a size and shape of the base and/or the high field strength structure of the tip; and/or, the number of the emission sites is adjusted by adjusting a size of the high field strength structure; and/or, a magnitude or a consistency of voltages at which the electron source emits current is adjusted by adjusting a structure of the base and/or a structure of the high field strength structure; and/or, a direction of an emission current is adjusted by adjusting a shape of a top of the tip. Herein, the extraction voltage may be lower than −0.5 KV, for example, the extraction voltage is −0.4 KV.

According to an embodiment of the present disclosure, the high field strength structure or the active region having the larger reaction activity is located at a central position of a surface of the base; and/or, the high field strength structure is located on a base having a size greater than a given threshold; and/or, the metal atoms are located at a top of the high field strength structure or at a central position of a surface of the base.

According to an embodiment of the present disclosure, an operation condition of the tip comprises: in a case where a temperature of the tip is less than or equal to 1000K, an operation pressure is less than or equal to $10^{-3}$ Pa; or, in a case where a temperature of the tip is greater than or equal to 500K, and less than or equal to 800K, an operation pressure is less than or equal to $10^{-6}$ Pa; or, in a case where a temperature of the tip is less than or equal to 150K, an operation pressure is less than or equal to $10^{-6}$ Pa. Since the formation temperature and the operating temperature of the emission site are lower, the structure of the electron source does not change, the structure of the electron source does not change during operation, and the applied voltage value does not change.

According to an embodiment of the present disclosure, a size of the emission site is in an order of nanometer or sub-nanometer, that is, the size of the emission site may be less than the size of the protrusion; and a value of an emission current of the emission site of the tip is up to an order of 10 mA by means of adjusting an operation voltage.

According to an embodiment of the present disclosure, the electron source has a cold field emission characteristic, and a magnitude of an emission current is adjusted by adjusting an extraction voltage.

According to another aspect of the present disclosure, there is provided an electron gun, comprising: the electron source as described above for emitting electrons, a cooling device, a heating device and a gas introduction device. The cooling device is configured for dissipating heat for the electron source, the electron source is fixed to the cooling device by an electrically insulating heat conductor, the heating device is configured for heating the electron source to adjust a temperature of the electron source, and the gas introduction device is configured for introducing a hydrogen-containing gas. Since the formation temperature and the operating temperature of the emission site are lower, the structure of the electron source does not change during operation, the applied voltage value does not change, and the voltage value is stable, all these make the design of the electron gun simpler.

According to an embodiment of the present disclosure, at least one emission site may be further removed from the electron source by the following operations: after one or more fixed emission sites are formed on at least one of the tips, gas molecules are adsorbed on the emission site by applying an electric field, then the emission capability of the tip will be lowered or even disappear, so as to remove at least one emission site.

BRIEF DESCRIPTION OF THE DRAWINGS

The above objects, features and advantages and others of the present disclosure will become more apparent by means of the description of the embodiments of the present disclosure below with reference to the accompanying drawings. In the drawings.

DETAILED DESCRIPTION OF EMBODIMENTS

Hereinafter, the embodiments of the present disclosure will be described with reference to the accompanying drawings. However, it should be understood that the description is only exemplary, and is not intended to limit the scope of the present disclosure. In the following detailed description, numerous specific details are set forth for facilitating the explanation to provide a thorough understanding of the embodiments of the present disclosure. However, it is apparent that one or more embodiments may be practiced without these specific details. In addition, the description of well-known structures and techniques is omitted in the specification in order to avoid unnecessarily misunderstanding the concept of the present disclosure.

The terms used herein are merely for the purpose of describing the particular embodiments, rather than limiting the present disclosure. The terms "comprise", "include" and the like used herein indicate the presence of the described feature, step, operation and/or component, but rather excluding the presence or addition of one or more features, steps, operations and/or components.

All the terms (comprising technical and scientific terms) used herein have the meanings commonly understood by those skilled in the art, unless otherwise defined. It should be noted that the terms used herein are to be interpreted as having meanings consistent with the context of the present specification and should not be interpreted in an ideal or too inflexible manner.

In a case where an expression like "at least one of A, B and C, etc." is used, it should generally be interpreted according to the meaning of the expression as commonly understood by those skilled in the art (for example, "a structure having at least one of A, B, and C" shall comprise, but is not limited to, a structure having A alone, B alone, C alone, A and B, A and C, B and C, and/or A, B, and C). In a case where an expression like "at least one of A, B, or C, etc." is used, it should generally be interpreted according to the meaning of the expression as commonly understood by those skilled in the art (for example, "a structure having at least one of A, B, and C" shall comprise, but is not limited to, a structure having A alone, B alone, C alone, A and B, A and C, B and C, and/or A, B, and C). It should also be appreciated by those skilled in the art that transitional conjunctions and/or phrases that are arbitrarily representing two or more optional items, whether in the specification, claims, or drawings, are to be construed as the possibility of one of the items, either or both of these items. For example, the phrase "A or B" should be understood as including the possibility of "A" or "B", or "A and B".

The field emission behavior in the prior art will be firstly described below in order to better understand the technical solutions of the present disclosure.

Figure 1:
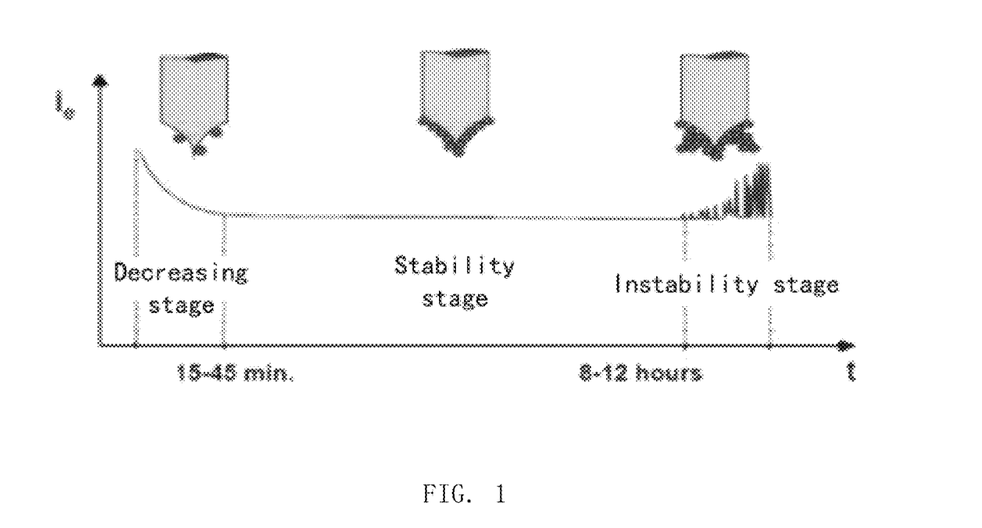
FIG. 1 schematically illustrates a typical field emission behavior of an electron source of a (310) oriented single-crystal tungsten emitter in the prior art.

FIG. 1 schematically illustrates a typical field emission behavior of an electron source of a (310) oriented single-crystal tungsten emitter in the prior art.

As shown in FIG. 1, the existing electron source, for example, the electron source of a (310) oriented single-crystal tungsten, undergoes the following three stages during use. Firstly, the clean electron source enters a stability period (Stability) in company with the adsorption of gas. However, with the further adsorption of gas, noise of the current gradually appears, entering an instability period (Instability). Then, the stability of the electron source is deteriorated, and flashing process is required (heating to about 2000° C. in a short time) to return to the steady state. If it is not flashing processed in time, contamination would gradually appear on the surface, and the emission current would start to fluctuate drastically, eventually leading to burnout. Regarding the above burnout, the inventors' further studies have shown that it is closely related to ion bombardment. This is due to the fact that the gas molecules in the surrounding space of the tip will be ionized after the electrons are emitted, and then bombard the tip. One possibility is that the surface of the tip is bombarded to form a plurality of protrusions, and the plurality of protrusions respectively serve as emission sites, and it finally causes excessive current, resulting in the burnout. There is also a mechanism in which the gas molecules adsorbed to the surface of the tip or a combination thereof with other substances are continuously moved under an electric field, and finally gathered into a nano-scale protrusion as an emission site on a defect point on a surface (for example, a defect point generated by ion bombardment), and the rapid growth of the emission site causes an overcurrent, which eventually leads to the burnout of the tip.

Further, the aforementioned problems become more serious at a larger emission current. Generally, the total emission current for stable operation for a long time is ~10 microamperes, and the utilization rate is very low. In view of the aforementioned drawbacks, the Schottky thermal-field emission source is dominant in the field of high-brightness electron sources.

Essentially, for the CFE, no material can avoid the effects of gas adsorption and ion bombardment. However, if the operation is under high current (>10 microamperes), the electron excitation degassing (especially taking place at the extraction electrode with electron bombardment) will further degrade the vacuum degree, which results in poor emission stability of the tip, and extremely large fluctuation range, thereby failing to operate stably for a long time. Therefore, how to provide a stable and large field emission current has been one of the most important challenges in the development of cold field emission electron sources.

In order to avoid the above effects of gas adsorption and ion bombardment, the current field emission electron source (generally referring to a metal tip) can only work in ultra-high vacuum (<$10^{-8}$ Pa), which seriously restricts the application range of the CFE. Further intensive research relating to this has been carried out by the inventors, and the following characteristics are found. The components of the residual gas in the vacuum comprise $H_2$, CO, and $CO_2$, but the main component is $H_2$. The adsorption of $H_2$ causes the emission capability of the clean surface to gradually deteriorate. It can be concluded that in this vacuum range, the influence of $H_2$ fundamentally determines the field emission performance of the tip. Therefore, how to deal with the influence of $H_2$ becomes the key to achieve a high stability of tip. There are also some technical solutions in the prior art that can alleviate the problem of gas adsorption. For example, Keigo Kasuya et al. invented a technique (mild flashings at 700° C.) by further increasing a vacuum degree of a chamber to an order of $1 \times 10^{-9}$ Pa, and this technique allows the W (310) surface to be always in a cleaner emission state, extending its operation time and achieving high emission capability. The technical solution of this patent has been widely used in Hitachi's electron microscope products.

In addition, there are some technical solutions in which some dissociative particles (atomic clusters) on the surface of the tip are used as the emission sites, which is also a solution way to be attempted. These dissociative substances may be contaminants formed by prolonged placement of the tip under poor vacuum degree, and the action of the electric field allows these dissociative substances to move somewhere on the tip. These emission sites have a very small beam angle (~5°), the extraction voltage is extremely low, and the brightness can reach more than 10 times that of the conventional W (310). Although it is not possible to form a large emission current (generally steadily giving the current of ~10 nA), it exhibits excellent stability (<$1 \times 10^{-7}$ Pa). One possible inference is that the very small beam angle and emission area can effectively reduce the effects of ion bombardment. However, as mentioned above, this kind of dissociative substances is not fixed, and the inventors have found that when the current is large (>1 uA), the electron source is easily burned out, and in the operation process, such substances continuously appear, its emission state is gradually changed, and it is difficult to maintain it for a long time. Another problem is that when it is exposed to the atmosphere, it is highly susceptible to the interference of the gas since the size of the substance is comparable with the gas molecules.

Based on the above various analyses, inferences, and experiments, the inventors provide an electron source according to the present disclosure, it can achieve a long-term stable operation thereof, it can provide a large field emission current, can work in a poor vacuum environment, and it is also less susceptible to the interference of the gas even it is exposed to the atmosphere.

An embodiment of the present disclosure provides an electron source, comprising one or more tips, wherein at least one of the tips comprises one or more fixed emission sites, the emission sites comprise a reaction product of metal atoms on a surface of the tip with gas molecules. The metal atoms on the surface of the tip are fixed on the surface of the tip, the reaction product formed thereby with the gas molecules is rooted on the surface of the tip, and the reaction product is a reaction product formed by the reaction of the metal atoms with the gas molecules under a condition approximate to the operation condition, the reaction product has less reaction activity to react with the gas molecules again, therefore it has a high stability. Further, since the amount of the reaction product can be controlled, it is possible to provide a large field emission current by increasing the amount of the reaction product. In addition, since the reaction product is a reaction product formed by the reaction of the metal atoms with the gas molecules, it is less susceptible to the interference of the gas even it is exposed to the atmosphere.

Figure 2:
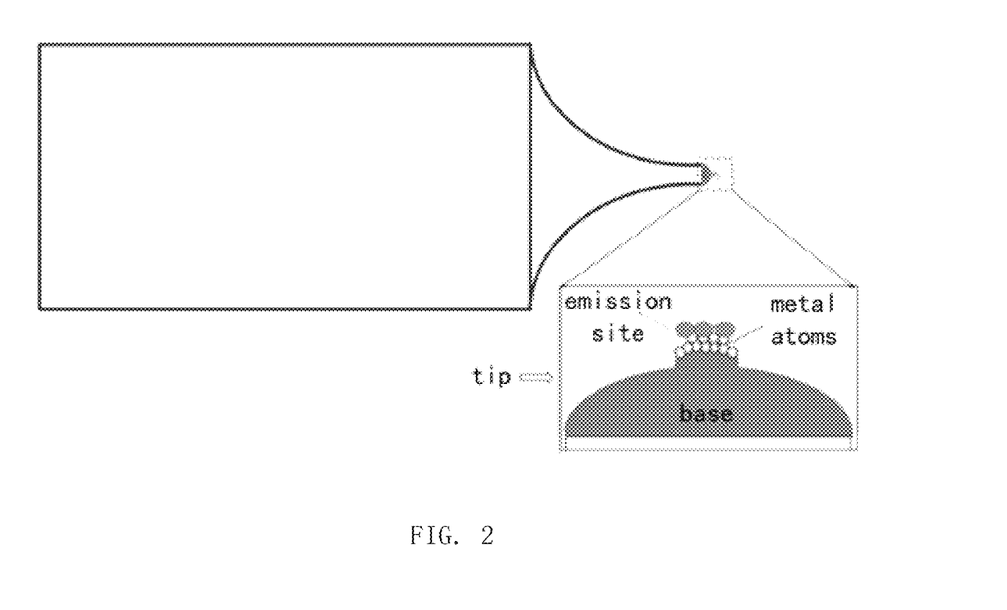
FIG. 2 schematically illustrates an electron source according to an embodiment of the present disclosure.

FIG. 2 schematically illustrates an electron source according to an embodiment of the present disclosure.

As shown in FIG. 2, the electron source may comprise one or more tips. For convenience of description, one tip is taken as an example to describe all the embodiments.

The tip may comprise one or more emission sites that are fixed to the surface of the tip, and the emission sites may be a reaction product of metal atoms on the surface of the tip with gas molecules.

In one embodiment, the reaction product of the metal atoms on the surface of the tip with the gas molecules under an electric field may be implemented by various implementations, for example, applying a voltage directly to the tip to form a higher field strength on the surface of the tip, to promote the reaction of the metal atoms on the surface of the tip with the gas molecules to form the reaction product; or applying a voltage to a field strength generating structure (for example, an electrode or the like) near the tip to form an electric field, thereby forming a higher field strength on the surface of the tip, to promote the reaction of the metal atoms on the surface of the tip with the gas molecules to form the reaction product. In short, the field formed on the surface of the tip and the manner in which the field is formed are not limited herein, as long as it is possible to form a field (for example, an electric field) on the surface of the tip, which is capable of promoting the metal atoms on the surface of the tip to react with the surrounding gas molecules to form a reaction product.

In the embodiment in which the field is formed by applying a voltage to the tip, in an exemplary example, the electric field is generated by applying a positive bias, a negative bias, or a combination of a positive bias and a negative bias to the tip. If a positive bias is applied, the strength of the electric field comprises 1 to 50 V/nm; if a negative bias is applied, the strength of the electric field comprises 1 to 30 V/nm.

The emission site may be formed at a designated position of the tip, for example, within a certain range of a position where the tip axis intersects the surface of the tip. Alternatively, the emission site may also be formed on a specific structure, such as a protrusion or other structures having a field strength advantage to preferentially form the reaction product of the metal atoms with the gas molecules. The emission site may also be formed at a specific region having reaction activity, such as a specific metal atom region where they are more likely to react with the gas molecules. Of course, a combination of the above two cases may be used. They are not limited herein.

The metal atoms may be metal atoms on the surface of the body of the tip, that is, the type of the metal atoms is the same as the type of the body of the tip, and they may also be a different kind of metal atoms formed on the surface of the tip by evaporation, electroplating or the like. Preferably, the metal atoms adopt a metal material having a melting point higher than 1000K, which is more stable and facilitates cleaning of the tip by the heat treatment method or the like, as described above. For example, the metal material having a melting point higher than 1000K may comprise any one or more of the following: tungsten, iridium, tantalum, molybdenum, niobium, hafnium, chromium, vanadium, zirconium, titanium, rhenium, palladium, platinum, rhodium, osmium, ruthenium, gold, and metal-hexaboride. For example, a certain kind of metal atoms alone acts as the metal atoms on the surface of the tip, or a laminate formed of several kinds of metal atoms, for example, a laminate of a titanium layer, a platinum layer, and a tungsten layer, or a non-monoplasmatic metal layer formed by mixing several kinds of metal atoms, act as the metal atoms, which is not limited herein.

The gas molecules may be introduced by a gas introduction device, for example, they are specific gas molecules introduced through a gas flow valve or the like, or may be gas molecules remaining in the vacuum chamber. Of course, a combination of the above two cases may be used. They are not limited herein. The gas molecules comprise hydrogen-containing gas molecules, and any one or more kinds of the following gas molecules: nitrogen-containing gas molecules, carbon-containing gas molecules, or oxygen-containing gas molecules. The above gas molecules may be the introduced gas molecules, and therefore the gas introduction amount can be dynamically adjusted. Generally, when introduced, the vacuum degree is $<10^{-4}$ Pa. When the residual gas in the vacuum chamber is directly utilized, the main residual gas in the vacuum chamber is hydrogen gas. Preferably, the hydrogen-containing gas molecules comprise hydrogen gas.

It should be noted that the temperature at which the emission site disappears, such as the decomposition temperature, may be lower than the temperature at which the body of the tip disappears in order to remove the emission site, and the disappearance temperature of the emission site may be higher than the operating temperature and the temperature at which the adsorbed gas molecules are desorbed, such that it is convenient to carry out desorption by a simple heat treatment (for example, flashing or other heat treatments) to restore the electron source to a stable state.

Due to its structural characteristics, the electron source provided by the present disclosure has a low extraction voltage of the emission site, a fixed and non-dissociative emission site, a long operation life, and can operate under a poor vacuum degree. Since the formation temperature and the operating temperature of the emission site are lower, the structure of the electron source does not change during operation, and the applied voltage value is stable and does not change. For example, it can operate under the following operation conditions, for example, in a case where a temperature of the tip is less than or equal to 1000K, an operation pressure is less than or equal to $10^{-3}$ Pa; or, in a case where a temperature of the tip is greater than or equal to 500K, and less than or equal to 800K, an operation pressure is less than or equal to $10^{-6}$ Pa; or, in a case where a temperature of the tip is less than or equal to 150K, an operation pressure is less than or equal to $10^{-6}$ Pa. The size of the emission site is in an order of nanometer or sub-nanometer. By adjusting the operation voltage, the emission current of the emission site of the tip can reach the order of 10 mA. The electron source has a cold field emission characteristic, and a magnitude of the emission current may be adjusted by adjusting the extraction voltage. In a preferred embodiment, the metal material is tungsten, and accordingly, the emission site is a hydrogen tungsten compound.

Figure 3:
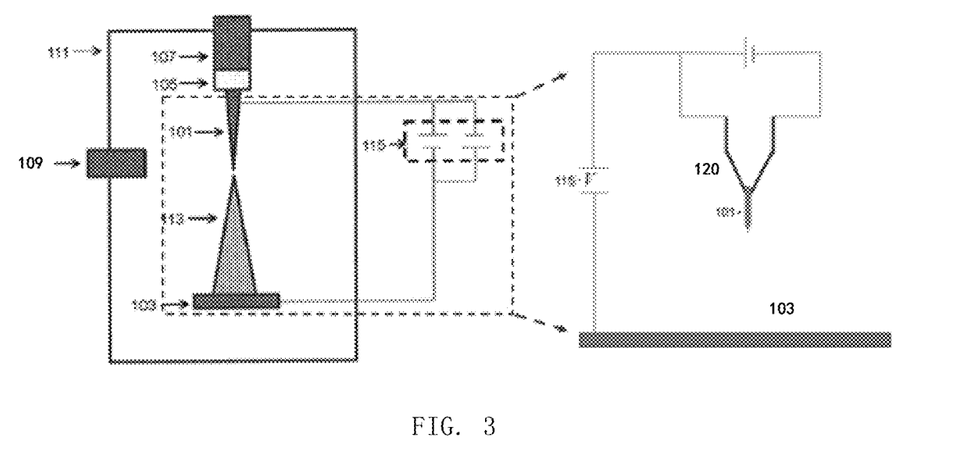
FIG. 3 schematically illustrates a preparation and an operation environment of an electron source according to an embodiment of the present disclosure.

FIG. 3 schematically illustrates a preparation and an operation environment of an electron source according to an embodiment of the present disclosure.

As shown in FIG. 3, a preparation and operation apparatus may comprise a vacuum chamber 111, a cooling head 107 (the cooling head 107 comprises a heating device, which is not shown), a sample holder 105, an electron source 101, a high voltage power source 115, a particle beam 113, a fluorescent screen assembly 103 and a gas introduction device 109, wherein the right figure is an enlarged schematic view of the dotted line frame in the left figure. The sample holder 105 may comprise a hairpin 120 for fixing the electron source 101, and the upper power source is the power source that heats the tip. This makes it possible to heat the electron source 101 and/or apply voltage to the electron source 101, and it is also possible to control the gas in the vacuum chamber, and the electron emission of the electron source can be observed through the fluorescent screen assembly 103.

Figure 4:
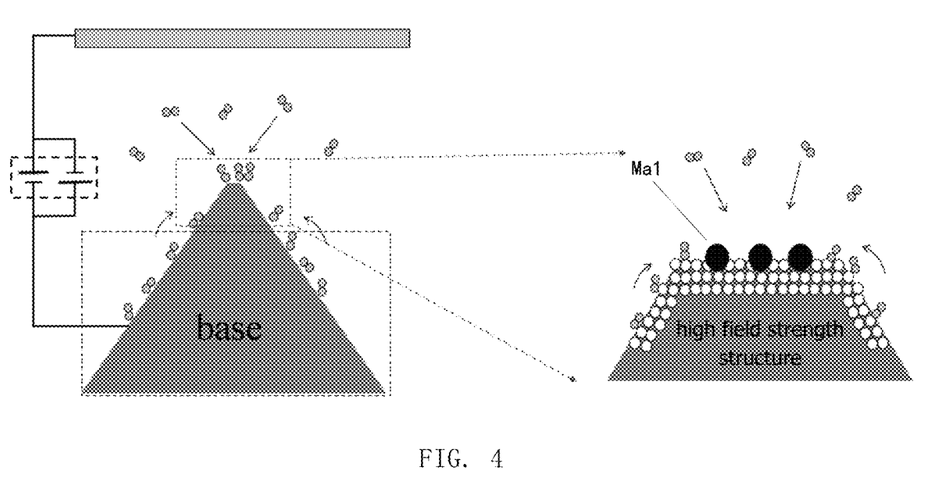
FIG. 4 schematically illustrates a process of preparing an electron source according to an embodiment of the present disclosure.

FIG. 4 schematically illustrates a process of preparing an electron source according to an embodiment of the present disclosure.

As shown in FIG. 4, the right figure is an enlarged schematic view of the image in the dotted line frame in the left figure, and the dotted line frame in the bottom of the left figure is schematic base. As can be seen from the left figure, after the bias is applied to the electron source, since the field strength at the top of the tip is the strongest, the gas molecules in the environment (gray dots in the left figure) will gradually move toward the top of the tip, which is one of the reasons for the decline in the emission capability of the electron source of single-crystal tungsten in the prior art. As can be seen from the right figure, as the gas molecules move to the top of the tip of the electron source, a field (such as an electric field) is formed at the tip to make the gas molecules react with the metal atoms (white dots) on the surface of the tip to form a reaction product (black dots, i.e., the emission sites, abbreviated as Ma1). The black dots would be rooted in the surface of the tip, rather than dissociating on the surface of the tip.

Figure 5A:
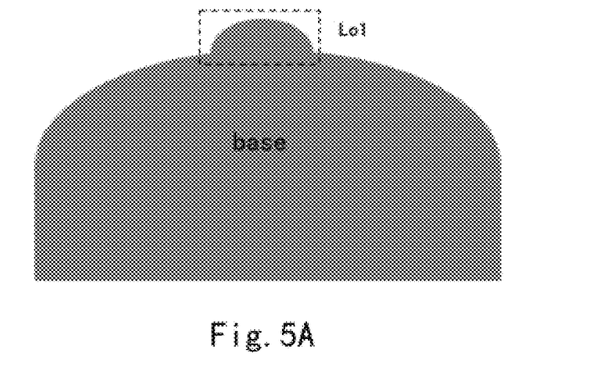
FIG. 5A schematically illustrates a high field strength structure on a base according to an embodiment of the present disclosure.

FIG. 5A schematically illustrates a high field strength structure on a base according to an embodiment of the present disclosure.

As shown in FIG. 5A, at least one of the tips comprises a base and one or more high field strength structures on the base having a higher field strength than that of other portions of the base, wherein an outer surface of at least one of the high field strength structures comprises metal atoms. The number of the protrusions may be one, three, five, ten, etc., which is not limited herein.

It should be noted that the material of the high field strength structure and the material of the base may be the same or different. Furthermore, a material of the metal atoms on surfaces of the base and/or the high field strength structure is the same as or different from a material of the high field strength structure, and if they are different, the metal atoms on the surfaces of the base and/or the high field strength structure may be formed by an evaporation process, an electroplating process or other methods, which is not limited herein. In addition, a material of the metal atoms on surfaces of the base and/or the high field strength structure is the same as or different from a material of the base, and if they are different, the metal atoms on the surfaces of the base and/or the high field strength structure may be formed by an evaporation process, an electroplating process or other methods, which is not limited herein. Further, the material of the base, the material of the high field strength structure and the material of the body of the tip are the same or different, which is not limited herein. Accordingly, in the reaction with the gas molecules under a vacuum condition, the metal atoms on at least a portion of the surface of the protrusion have the same or larger reaction activity than that of other portions of the surface of the base.

As shown in FIG. 5A, the high field strength structure may comprise a protrusion corresponding to the Lo1 position. The protrusion may have a size in an order of sub-nanometer to 100 nanometers. Due to the high field strength advantage at the protrusion, when a voltage is applied to the tip, at least a portion of the metal atoms on the surface of the protrusion will form a reaction product with the gas molecules under the action of the field strength. This makes it easy and quick to form an emission site at a designated position on the surface of the tip. In addition, the number of the emission sites on the surface of the protrusion can be adjusted by adjusting the size of the protrusion, the magnitude of the applied bias, the time length thereof or other parameters, for example, by increasing the time length of the applied bias or increasing the size of the protrusion, more emission sites may be formed to increase the emission current or the like.

The protrusion is formed by any one or more of the following methods: heat treatment, application of electric field, thermal-field treatment, etching, and nano-machining or by a method of, for example, forming a protrusion by plating a layer of metal atoms on a single crystal metal tip followed by thermal annealing. It should be noted that the methods in which a protrusion may be formed on the surface of the tip are applicable, which is not limited herein.

Optionally, the base is made of an electrically conductive material having a melting point above 1000K, the high field strength structure is made of an electrically conductive material having a melting point above 1000K, a material of the metal atoms on surfaces of the base and/or the high field strength structure is a metal material having a melting point above 1000K. and The reaction product of the metal atoms with the gas molecules comprises a reaction product of metal atoms having a melting point above 1000K with gas molecules under a vacuum condition.

Figure 5B:
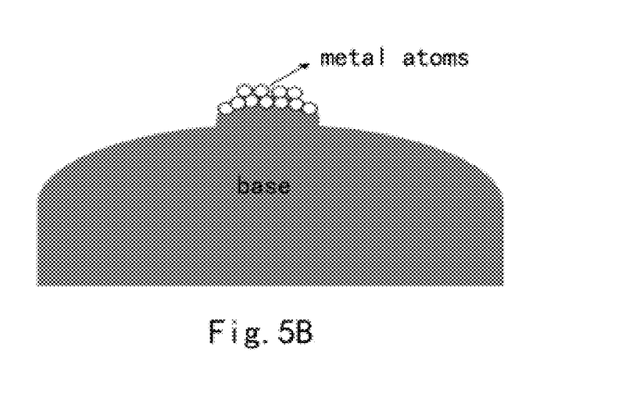
FIG. 5B schematically illustrates metal atoms on a surface of a high field strength structure according to an embodiment of the present disclosure.

Examples of the material having a melting point above 1000K are as described above and will not be described herein. The tip preferably adopts an electrically conductive material having a melting point above 1000K, which is more stable and facilitates cleaning and restoring of the tip by the heat treatment method or the like, as described above. FIG. 5B schematically illustrates metal atoms on a surface of a high field strength structure according to an embodiment of the present disclosure.

It should be emphasized that the materials of the base, the high field strength structure and the body of the tip may be metal materials or non-metal materials (for example, electrically conductive materials). If the electron source does not comprise a high field strength structure, it is only to be ensured that the surface of the base comprises metal atoms, and the base can introduce an electric current; if the electron source comprises a high field strength structure, it is only to be ensured that the surface of the high field strength structure comprises metal atoms, and the high field strength structure can introduce an electric current.

In a preferred embodiment, the high field strength structure is located at a central position of the surface of the base;

or, the high field strength structure is located on a base having a size greater than a given threshold, for example, a base having a larger size; or, the metal atoms are located at a central position of the top surface of the high field strength structure.

In addition, a dimension of a beam angle of an electron beam may be adjusted by adjusting a size and shape of the base and/or the high field strength structure of the tip, the number of the emission sites may be adjusted by adjusting a size of the high field strength structure, a magnitude or a consistency of voltages at which the electron source emits current may be adjusted by adjusting a structure of the base and/or a structure of the high field strength structure, and a direction of an emission current may be adjusted by adjusting a shape of a top of the tip. For example, if the size of the base increases, then the beam angle reduces; if the field evaporation causes the height of the protrusion to decrease, then the beam angle reduces; the smaller the size of the protrusion is, the smaller the number of the emission sites under the same electric field is; etc.

In the electron source provided by the present disclosure, at least one of the tips comprises a base and one or more high field strength structures on the base having a higher field strength than that of other portions of the base, and an outer surface of at least one of the high field strength structures comprises metal atoms. The metal atoms on the surface of the high field strength structure are more likely to react with the gas molecules to form a reaction product in the same environment by virtue of the field strength advantage, so as to preferentially generate the emission site at the high field strength structure.

Figure 5C:
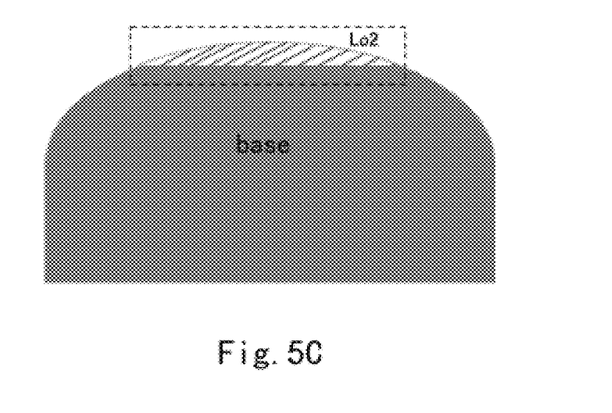
FIG. 5C schematically illustrates an active region on a base according to an embodiment of the present disclosure.

FIG. 5C schematically illustrates an active region on a base according to an embodiment of the present disclosure.

As shown in FIG. 5C, at least one of the tips comprises a base and one or more active regions on the base having larger reaction activity than that of other portions of the base, corresponding to the Lo2 position, wherein an outer surface of at least one of the active regions comprises metal atoms. The active region is shown in the shaded region of FIG. 5C. The number of the active regions may be 1, 3, 5, 10, etc., which is not limited herein, and the emission site may be preferentially formed in the active region located at the top region of the tip.

It should be noted that the material of the base and the material of the body of the tip may be the same or different. The metal atoms in the active region may be formed by evaporation, electroplating or the like, for example, a certain area of metal atom layer is formed at the intersection of the axis of the tip and the surface by electroplating, the material of the metal atom layer has higher reaction activity with gas molecules, compared with the material of other surfaces of the base. Accordingly, the metal atoms on the surface of the active region of the base have larger reaction activity than that of other portions of the surface of the base in a reaction with gas molecules under a vacuum condition.

In a preferred embodiment, the active region having the larger reaction activity is located at a central position of the surface of the base; or, the metal atoms are located at a central position of the surface of the base.

In the electron source provided by the present disclosure, at least one of the tips comprises a base and one or more active regions on the base having larger reaction activity than that of other portions of the base, and an outer surface of at least one of the active regions comprises metal atoms. The metal atoms on the surface of the active region are more likely to react with the gas molecules to form a reaction product in the same environment by virtue of the reaction activity advantage, so as to preferentially generate the emission site at the active region.

Figure 5D:
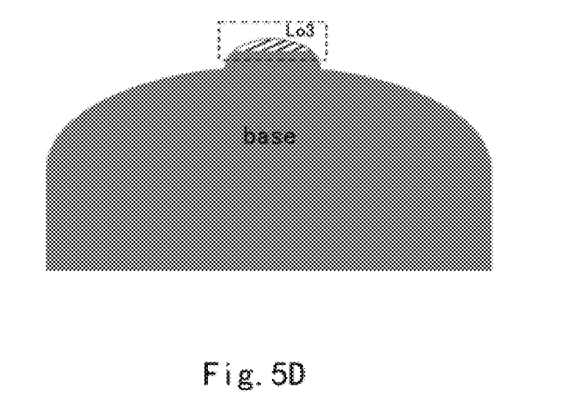
FIG. 5D schematically illustrates an active region on a high field strength structure according to an embodiment of the present disclosure.

FIG. 5D schematically illustrates an active region on a high field strength structure according to an embodiment of the present disclosure.

As shown in FIG. 5D, at least one of the tips comprises a base and one or more high field strength structures on the base having a higher field strength than that of other portions of the base, at least a portion of surface of the high field strength structure is an active region having a larger reaction activity, corresponding to the Lo3 position, and an outer surface of the active regions comprises metal atoms.

In this embodiment, for the tip comprising a protrusion, metal atoms on at least a portion of the surface of the protrusion have the same or larger reaction activity than that of other portions of the surface of the base in a reaction with gas molecules under a vacuum condition. In this way, it is possible to more precisely control the formation of the emission site on the designated region of the protrusion, for example, an emission site is formed in the shaded region on the protrusion of FIG. 5D. The forming manner in which the metal atoms on the surface of the active region are formed may refer to the forming manner of the active region in the previous embodiment, which will not be described in detail herein.

In the electron source provided by the present disclosure, at least one of the tips comprises a base and one or more high field strength structures on the base having a higher field strength than that of other portions of the base, at least a portion of surface of the high field strength structure is an active region having a larger reaction activity, and an outer surface of the active region comprises metal atoms. The metal atoms on the surface of the active region are more likely to react with the gas molecules to form a reaction product in the same environment by virtue of the field strength advantage and the reaction activity advantage, so as to preferentially generate the emission site at the active region.

Figure 6:
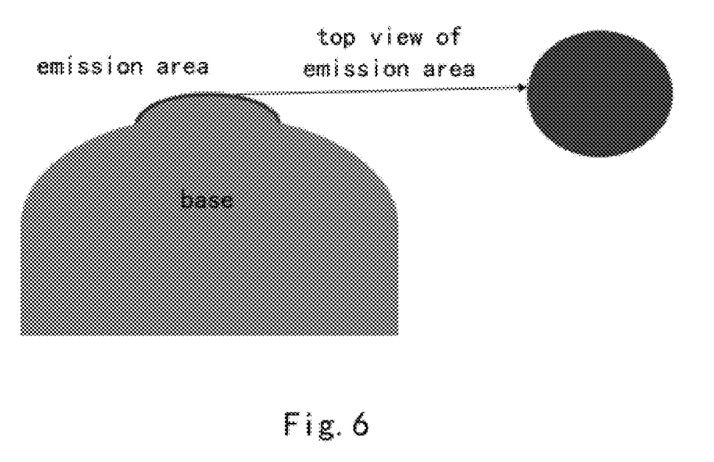
FIG. 6 schematically illustrates an emission area having emission sites according to an embodiment of the present disclosure.

FIG. 6 schematically illustrates an emission area having emission sites according to an embodiment of the present disclosure As shown in FIG. 6, the tip having a protrusion is taken as an example. When emission sites are formed on the entire surface of the protrusion, the top view of the emission sites can be referred to the right figure of FIG. 6. It should be noted that in the process of forming the emission sites on the surface of the protrusion, in the region where the field strength is higher, it has a higher probability of forming the emission sites first, but the emission sites are not necessarily formed only in the region with the highest field strength. Of course, since the apex position of the protrusion as shown in FIG. 6 has the strongest field strength, and the probability of forming the emission sites at the apex first is also greatest. The shape of the protrusion in FIG. 6 is hemispherical, alternatively, it may be square, polygonal, mesa shape, semi-elliptical, or other geometric structures, which are not limited herein.

It should be noted that a disappearance temperature of the emission site is lower than a smallest value of disappearance temperatures of the base, the high field strength structure, and the metal atoms, and the disappearance temperature of the emission site is higher than an operating temperature of the electron source; or, a disappearance temperature of the emission site is lower than a smallest value of disappearance temperatures of the base, the high field strength structure, and the metal atoms, and the disappearance temperature of the emission site is higher than a larger value of an operating temperature of the electron source and a desorption temperature of the gas molecules adsorbed on any of the tips. When the disappearance temperature of the emission site is higher than the desorption temperature of the gas molecules adsorbed on any of the tips, it facilitates the desorption of the gas molecules by heating, and facilitates improving the stability of the electron source by simple processing.

The test environment for the electron source may be referred to FIG. 3, and the background vacuum degree of the vacuum chamber 111 is less than or equal to $10^{-3}$ Pa (generally less than $10^{-6}$ Pa). An insulated sample holder 105 is plated on the cooling head 107, thereby a heating device (for example, a heating plate, a heating rod, etc. which is not shown here) may be plated on the sample holder, and the temperature may be adjusted between 10 and 500K. A pretreated tip (for example, a tungsten single crystal tip, which may be a tip having a protrusion, the size of the protrusion being in an order of nm or sub-nm, or a tip having a region with a larger reaction activity) is placed on the sample holder 105. A voltage is applied to the tip, and the voltage may be a positive high voltage $V_P$ or a negative high voltage $V_N$. The power source 115 may be a dual output high voltage power source with an output range of ±0~30 kv. The gas introduction device 109 is used for introducing reaction gas molecules, for example, $H_2$, or other reaction gases, for example, H-containing gas, like $H_2O$, $CH_4$, etc. The gas introduction amount may be dynamically adjusted. Generally, when introduced, the vacuum degree is $<10^4$ Pa (it should be noted that the residual gas molecules in the chamber may be directly utilized, and the main component thereof is hydrogen gas). The fluorescent screen assembly 103 is used to convert a particle beam image into a light image. When the signal is small, the signal may be amplified by using a fluorescent screen-multichannel plate assembly. When a voltage is applied to the tip, the particle beam may be extracted. The applied voltage may be a positive voltage or a negative voltage. When the positive voltage is applied, a positive ion beam is output in a case where there is imaging gas; when the negative voltage is applied, an electron beam is output.

The preparation process of the electron source is demonstrated below in a specific embodiment.

Figure 7:
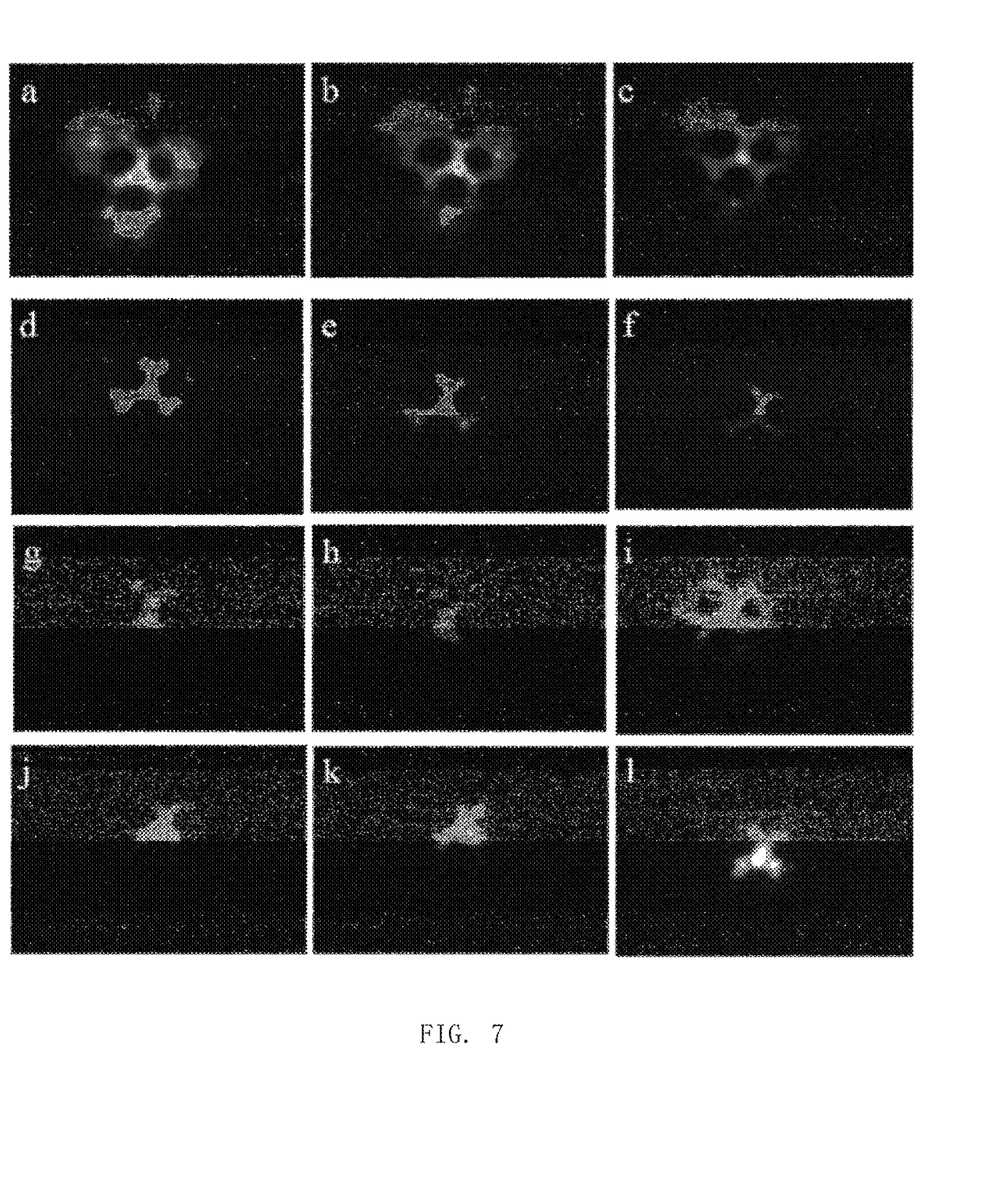
FIG. 7 schematically illustrates a formation process of emission sites according to an embodiment of the present disclosure.

FIG. 7 schematically illustrates a formation process of emission sites according to an embodiment of the present disclosure.

The emission site Ma1 is formed by the reaction of gas molecules and metal atoms on the surface under the action of a strong electric field, and the emission site Ma1 is formed at a certain temperature. The formation process of the emission site is based on an in-depth study of a hydrogen adsorption behavior in a small region of the surface of the tip.

First, a tip of a (111) oriented single-crystal tungsten is provided, and a protrusion is formed on the tip by the method as described above, for example, the tip undergoes a flashing process (heating to 1200K for 3s, and applying a bias voltage in the process, etc.). In this way, a nano-scale protrusion may be formed at a central position of the surface of the tip, and the surface thereof is clean. Referring to FIG. 7a, when a negative voltage of up to −2 KV is applied to the tip, a field electron emission mode is formed. To avoid the effects of ion bombardment, the formation temperature of the emission site Ma1 is ~50K. In the entire formation process of the emission site, the emission current ($I_E$) is always controlled within 5 nA and the vacuum degree is $10^{-7}$ Pa.

As shown in FIG. 7b to FIG. 7e, the gas adsorption first causes a decrease in the emission capability, the emission pattern on the fluorescent screen of assembly 103 is gradually becoming dark, and the emission current is gradually decreased, that is, the emission capability of the existing tungsten cleaning surface is gradually decreased.

As shown in FIG. 7f, the emission pattern disappears almost completely over time, and at this time, the emission capability of the conventional tungsten cleaning surface almost completely disappears.

As shown in FIG. 7g, as the bias voltage is continuously applied to the electron source, the emission site of the present disclosure begins to form, and the composition of this emission site is different from that of the previous emission substance. In a case where tungsten is taken as an example for description, the previous emission substance is tungsten atoms of single-crystal tungsten, and this emission site is a reaction product of tungsten atoms on the surface of the tip with gas molecules, for example, a reaction product of tungsten atoms with hydrogen molecules. This reaction product is fixed on the surface of the tip.

As shown in FIG. 7h to FIG. 7k, as the bias voltage is continuously applied to the electron source or maintained for a period of time, the emission site eventually becomes brighter.

As shown in FIG. 7l, the emission site with high emission capability is finally formed, and the emission current is further increased. By comparing FIG. 7a with FIG. 7l, it can be clearly seen that the emission capability of the emission site is obviously improved, and the emission sites are more concentrated at the central protrusion position.

In the above process, since the current is always controlled to be very small, and the fluorescent screen is far away from the tip, and the vacuum degree is good, the influence of ion bombardment may be excluded. In addition, the addition of a positive high voltage can form a substance having the same field emission characteristic. At this time, there is no emission current at all, indicating that the dissociative atomic-scale particles caused by the ion bombardment do not participate in the formation process of the emission site Ma1.

In the formation process of the emission site Ma1, the gas (for example, $H_2$) is adsorbed, dissociated under the electric field, and further combined with the metal atoms on the surface to form a certain H-W reaction product (compound), which belongs to a kind of Ma1. It seems that this kind of compound is directly bonded to the surface and does not move. Similar substances can be formed at other positions, but they do not move and are always stable emission sites.

Among the parameters related to the emission capability, the emission capability of a single emission site can reach more than 30 uA. If a dense emission region is formed and the emission patterns are connected into one piece, then the total current can reach an order of 100 uA. If the emission area is increased (the number of the emission sites is increased), the emission current in an order of 10 mA can be achieved, significantly exceeding the stable emission capability of the existing CFE (~10 microamperes). Recently, Keigo Kasuya et al. reached an extreme emission current of about 3000 microamperes by strengthening the vacuum degree of the chamber to $4\times10^{-10}$ Pa, however, this vacuum degree is difficult to achieve.

Different emission capacities are achieved at different vacuum degrees. In general, a high emission current can be maintained at a high vacuum degree, and the maximum emission current is rapidly damped at a low vacuum degree.

Figure 8:
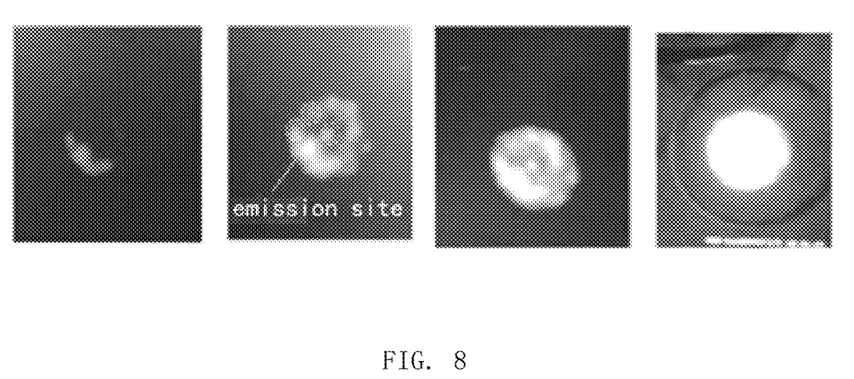
FIG. 8 schematically illustrates a formation process of emission sites according to another embodiment of the present disclosure.

FIG. 8 schematically illustrates a formation process of emission sites according to another embodiment of the present disclosure. As can be seen from the figure, the formed emission region is small and concentrated.

The tip terminated by the emission site has field emission consistency, that is, the voltage of the emission current is consistent, for example, when the emission current is 1 microamperes, the voltage is −1.2±0.1 KV.

Since the formation temperature and the operating temperature of the emission site are lower, the structure of the electron source does not change during operation, the applied voltage value does not change, and the stable voltage value makes the design of for example the electron gun simpler.

In addition, the magnitude and consistency of the voltage of the emission current of the electron source are adjusted by adjusting the structure of the base and/or the high field strength structure, for example, for the emission site formed on the protrusion which is formed on the tip by field etching, field evaporation, etc., when the emission current is 1 microampere, the voltage may be lower than −0.5 KV (for example, the extraction voltage is −0.4 KV), which makes the design of the electron gun structure simpler.

The structure, performance parameters, and the like of the electron source prepared by the above method will be further described below.

(1) Regarding the substance of the emission site

The electron source has good stability, the emission site (referring to the solid black balls in FIG. 4) can be stably rooted at a specific position on the surface of the tip, the plurality of emission sites can give a total current of mA order at most, it can operate under poor vacuum degree ($10^{-5}$ Pa), and it is easy to store.

Taking an electron source having a protrusion as an example:

Tip: the tip includes a base and a protrusion of nm order on the base, the size of the protrusion is of nm or sub-nm order. The emission site is formed on the surface of the protrusion.

The formation process of the emission site Ma1 is as follows: under a strong electric field (for example, in the range of 1~50V/nm, it should be noted that the electric field is affected by the voltage polarity and material properties), the gas molecules directly react with the metal atoms on the surface of the tip to form a gas-metal compound, the H-W compound will be described below as an example. At a higher vacuum degree, the main residual gas molecules are $H_2$. Since the electric field on the surface of the protrusion is the strongest, it is preferentially formed here.

The emission site Ma1 is a reaction product that is rooted on the surface of the tip and formed by the reaction of the gas molecules with the metal atoms on the surface of the tip. The positions of these emission sites are fixed and do not move, but a single emission site Ma1 may flicker at different emission currents.

The emission site Ma1 has a surface protection function: the emission site Ma1 is formed by the reaction of the metal atoms at the outermost surface with the gas molecules, that is, it is a reaction product, therefore it is difficult for it to interact with the surrounding gas molecules, for example, adsorb the gas molecules, etc. Even the gas is adsorbed, it is difficult to influence the emission site Ma1 on the surface of the tip, i.e., continue the chemical reaction immediately. The adsorbed gas on the emission site Ma1 can be effectively desorbed by means of low temperature heating treatment (<1000K), and the presence of the emission site Ma1 can be maintained. Even if the heating treatment removes the emission site Ma1 partially and the portion of the metal atoms is exposed, the emission site Ma1 can be further formed there during operation (in a case of the presence of the electric field E). Therefore, it is equivalent to an addition of protective layer to the tip, effectively blocking the reaction of the gas with the tip under a strong field. While for other surfaces where the emission site Ma1 is not formed, due to the weak local electric field, the emission capability is weak, the contrast may be neglected. This greatly improves the operation stability and prolongs the stability period of the electron source.

Regarding the operation conditions, the emission site Ma1 has strong environmental adaptability and can work in a vacuum of $10^{-5}$ Pa. If it is supplied with low temperature, it can work in a vacuum of $10^{-3}$ Pa. Of course, the higher the vacuum degree is, the longer the continuous working time is; and the smaller the emission current is, the longer the continuous working time is. Different emission current ranges can be selected under different vacuum conditions to be used according to specific needs.

Regarding the reason why the emission capability is significantly enhanced compared to the existing CFE, there may be two mechanisms: firstly, a significant reduction in the work function; and secondly, a formation of a pointed cone of an atom-scale emission site on surface. The combined effect of these two mechanisms makes the extraction voltage $V_0$ much lower (reduction ratio >~30%).

Regarding the field emission characteristic: the magnitude of the emission current can be directly controlled by the extraction voltage, and the output of pulse current (by applying pulse voltage) and constant current ((by applying constant voltage) can be realized.

Regarding the description of the emission area, for example, the area of the emission region on the upper surface of the protrusion, the emission area can be controlled and changed by for example adjusting the diameter of the protrusion on the head of the tip. The emission area can reach atomic level or 10 nm level. For the example an active region is included, the size of the emission area can be controlled by changing the area of the active region.

(2) Regarding the Formation Location of the Emission Site

The formation location (Lo) of the emission site Ma1 may be preselected by for example the following method: an electric field dominating region Lo1 is formed on the surface of the tip (referring to FIG. 5A, for example, an nm-level protrusion is formed) so that the electric field there is higher than other regions of the tip; or, an active region Lo2 is formed on the surface of the tip, and the region has greater reaction activity with the gas (referring to FIG. 5C, compared to other regions); or a region Lo3 (referring to FIG. 5D) having the above two features is formed. The protrusion may be formed by heat treatment, thermal-field treatment, etching, nano-processing, etc.; and the active atomic region may be formed by various atomic evaporation methods.

The size of the emission area can also be controlled by the above means, and its scale is of nm or atomic order. Preferably, Lo1 is located above a larger base of the tip.

The magnitude of the beam angle of the electron beam can be adjusted by controlling the sizes of the base of the tip and the protrusion.

Preferably, the tip has a geometry with a protrusion at the center. Preferably, the electric field strength at the surrounding region of the tip is weaker than the electric field strength at the center of the surface of the tip.

At least one layer or more layers at the outermost surface of the tip are made of metal atoms, which may be of various metal materials having a melting point higher than 1000K. In addition, the material of the body of the tip may be metal, or other electrically conductive materials, such as metal-hexaboride or the like, preferably having a higher melting point (e.g., >1000 K).

(3) Regarding Preparation Conditions

Tip condition: Taking a tip having a protrusion as an example, a nano-scale protrusion is formed on a region of the surface of the tip where the above substance (emission site) is needed to be formed, so that a strong surface electric field $E_s$ is generated on the surface of the protrusion when a bias voltage ($V_S$) is applied to the tip, where $E_S$ is greater than the electric field at its periphery.

Electric field condition: When a bias voltage $V_S$ is applied to the tip, the surface electric field of the protrusion on the tip is $E_S$, which is in an order of ~1V/nm. The $E_S$ (or $V_S$) may be positive, and its strength needs to ensure that the atoms on the surface of the tip do not evaporate; in addition, the $E_S$ (or $V_S$) may also be negative, and it is necessary to ensure that the emission does not cause the tip to be burned out due to overcurrent.

Gas molecules: The main component is $H_2$, or H-containing gas molecules. It may be realized by introducing external gas molecules, or it may be realized by directly utilizing the residual gas molecules in the vacuum.

Reaction process: Gas molecules (or ions) are adsorbed to the surface of the tip, and gradually react with the atoms on the surface of the tip under a strong field, to finally form a stable emission site.

Temperature range of the preparation process: The temperature should be less than the decomposition temperature of the emission site Ma1. According to observation, it should be less than 1000K. Preferably, in a preferred embodiment, the reaction temperature is below a low temperature 150K. In another preferred embodiment, the operating temperature is between 500 and 800K. Generally, the temperature needs to be satisfied in such a way that the surface topography of the tip is not altered, for example, it should be below the deformation temperature of the top of the tip.

Removal manner of the formed emission site: If the emission capability of the formed emission site is degraded, the degraded emission site may be removed. For example, the emission site on the surface may be removed by field evaporation, i.e., adding a positive high voltage. It is also possible to directly remove the emission site Ma1 by directly heating to more than 1000K. After the removal, the emission site Ma1 may be formed again in situ.

In the electron source provided by the present disclosure, since the emission site of the electron source is a reaction product of metal atoms fixed on the surface of the tip with gas molecules, rather than gas molecules, dissociative particles or the like that are dissociative on the surface of the tip, it would not incur over-current burnout due to that the dissociative emission sites gather together to form a new emission site, thereby effectively improving stability. Moreover, since the emission site comprises the reaction product, in comparison with metal atoms or other metal compounds (such as metal boride or the like), it has better stability in the working environment (with the presence of gas molecules), for example, being less likely to react with hydrogen in the working environment, further improving the stability of the electron source. In addition, the emission site of the electron source may be a reaction product of a single metal atom with gas molecules, that is, the emission site is composed of only one or several atoms, therefore an atomic-scale electron source having a low work function may be formed. Further, since the emission site is a reaction product of the gas molecules with the metal atoms on the surface of the tip, it is rooted in the surface of the tip, it is relatively less susceptible to ion bombardment, and less susceptible to the gas in the environment. Still further, the field emission current may be increased by increasing the number of the emission sites. In summary, the electron source provided by the present disclosure has the advantages of stability, large field emission current, operation at a relatively poor vacuum degree, easy storage, and so on.

According to another aspect of the present disclosure, there is provided an electron gun, comprising: the electron source as described above, a cooling device, a heating device and a gas introduction device. The electron source is configured for emitting electrons, the cooling device is configured for dissipating heat for the electron source, the electron source is fixed to the cooling device by an electrically insulating heat conductor, the heating device is configured for heating the electron source to adjust a temperature of the electron source, and the gas introduction device is configured for introducing a hydrogen-containing gas. Since the formation temperature and the operating temperature of the emission site on the electron source surface of the electron gun are lower, the structure of the electron source does not change during operation, the applied voltage value does not change, the voltage value is more stable so that the design of the electron gun is simpler.

It will be appreciated by those skilled in the art that the various embodiments of the present disclosure and/or the various features recited in the claims may be combined or integrated, even if such combinations or integrations are not explicitly described in the present disclosure. In particular, the various embodiments of the present disclosure and/or the various features recited in the claims may be combined or integrated without departing from the spirit and scope of the present disclosure. All such combinations and/or integrations fall within the scope of the present disclosure.

The embodiments of the present disclosure have been described above. However, the embodiments are merely for illustrative purposes and are not intended to limit the scope of the present disclosure. Although the various embodiments have been described above, this does not mean that the measures in the various embodiments cannot be advantageously used in combination. The scope of the present disclosure is defined by the appended claims and their equivalents. Numerous alternatives and modifications may be made by those skilled in the art without departing from the scope of the present disclosure, and such alternatives and modifications should fall within the scope of the present disclosure.

What is claimed is:

1. An electron source, comprising:
   one or more tips,
   wherein at least one of the tips comprises one or more fixed emission sites, and
   wherein the one or more fixed emission sites comprise a reaction product of metal atoms with gas molecules on a surface of a tip of the one or more tips under an electric field, the emission sites are rooted in the surface of the tip of the one or more tips, wherein the reaction is carried out without an ion bombardment.

2. The electron source according to claim 1,
   wherein, at least one of the tips comprises a base and one or more high field strength structures on the base having a higher field strength than that of other portions of the base, and an outer surface of at least one of the high field strength structures comprises metal atoms, and/or wherein at least one of the tips comprises a base and one or more active regions on the base having a larger reaction activity than that of other portions of the base, and an outer surface of at least one of the active regions comprises metal atoms, and/or wherein at least one of the tips comprises a base and one or more high field strength structures on the base having a higher field strength than that of other portions of the base, at least a portion of surfaces of the high field strength structures are active regions having a larger reaction activity than other portions of the surfaces, and outer surfaces of the active regions comprise metal atoms.

3. The electron source according to claim 1, wherein the electric field is generated by applying a positive bias, a negative bias, or a combination of a positive bias and a negative bias, wherein for applying a positive bias, a strength of the electric field comprises 1 to 50 V/nm, and wherein for applying a negative bias, the strength of the electric field comprises 1 to 30 V/nm.

4. The electron source according to claim 2, wherein the high field strength structure comprises a protrusion.

5. The electron source according to claim 4, wherein the protrusion has a size in an order of sub-nanometers to 100 nanometers.

6. The electron source according to claim 4, wherein the protrusion is formed by one or more of the following methods: thermal annealing, application of electric field, thermal-field treatment, etching, or nano-machining.

7. The electron source according to claim 4, wherein, for a tip comprising a protrusion, metal atoms on at least a portion of a surface of the protrusion have a same or larger reaction activity than that of other portions of the surface of the base in a reaction with the gas molecules under a vacuum condition, wherein, for a tip comprising no protrusion, the metal atoms on a surface of the active region of the base have larger reaction activity than that of other portions of the surface of the base in a reaction with the gas molecules under a vacuum condition.

8. The electron source according to claim 2, wherein, the base is made of an electrically conductive material; and/or wherein the high field strength structure is made of an electrically conductive material; and/or wherein the base and/or the high field strength structure have metal atoms on surfaces thereof; and/or wherein the high field strength structure is made of a same or different material from the base; and/or wherein a material of the metal atoms on surfaces of the base and/or the high field strength structure is the same as or different from a material of the high field strength structure, and if the material of the metal atoms on surfaces of the base and the high field strength structure are different, the metal atoms on the surfaces of the base and/or the high field strength structure are formed by an evaporation process or an electroplating process; and/or wherein a material of the metal atoms on surfaces of the base and/or the high field strength structure is the same as or different from a material of the base, and if the material of the metal atoms on surfaces of the base and the high field strength structure are different, the metal atoms on the surfaces of the base and/or the high field strength structure are formed by an evaporation process or an electroplating process.

9. The electron source according to claim 1, wherein, the gas molecules are introduced gas molecules and/or gas molecules remaining in a vacuum environment, wherein the gas molecules comprise hydrogen-containing gas molecules or a combination of hydrogen-containing gas molecules and one or more kinds of the following gas molecules: nitrogen-containing gas molecules, carbon-containing gas molecules, or oxygen-containing gas molecules.

10. The electron source according to claim 9, wherein the hydrogen-containing gas molecules comprise hydrogen gas molecules.

11. The electron source according to claim 8, wherein, the base comprises an electrically conductive material having a melting point above 1000K, and/or wherein the high field strength structure is made of an electrically conductive material having a melting point above 1000K, and/or wherein a material of the metal atoms on surfaces of the base and/or the high field strength structure is a metal material having a melting point above 1000K, and wherein the reaction product of the metal atoms with the gas molecules comprises a reaction product of metal atoms having a melting point above 1000K with the gas molecules under a vacuum condition.

12. The electron source according to claim 11, wherein the metal material comprises one or more of the following:

tungsten, tantalum, niobium, molybdenum, rhenium, hafnium, iridium, osmium, rhodium, ruthenium, platinum, palladium, gold, chromium, vanadium, zirconium, titanium, or metal-hexaboride.

13. The electron source according to claim 12, wherein the metal material comprises tungsten, and wherein the emission site comprises a hydrogen tungsten compound.

14. The electron source according to claim 2, wherein, a dimension of an opening angle of an electron beam is adjusted by adjusting a size and shape of the base and/or the high field strength structure of the tip, and/or wherein a number of the fixed emission sites is adjusted by adjusting a size of the high field strength structure and/or the active region, and/or wherein a magnitude or a consistency of voltages at which the electron source emits current is adjusted by adjusting a structure of the base and/or a structure of the high field strength structure, and/or wherein a direction of an emission current is adjusted by adjusting a shape of a top of the tip.

15. The electron source according to claim 14, wherein, the high field strength structure or the active region having the larger reaction activity is at a central position of a surface of the base, and/or wherein the high field strength structure is on a base having a size greater than a given threshold, and/or wherein the metal atoms are at a top of the high field strength structure or at a central position of a surface of the base.

16. The electron source according to claim 1, wherein an operation condition of the tip comprises:

in a case where a temperature of the tip is less than or equal to 1000K, an operation pressure is less than or equal to $10^{-3}$ Pa, or in a case where a temperature of the tip is greater than or equal to 500K, and less than or equal to 800K, an operation pressure is less than or equal to $10^{-6}$ Pa, or in a case where a temperature of the tip is less than or equal to 150K, an operation pressure is less than or equal to $10^{-6}$ Pa.

17. An electron gun, comprising:

the electron source according to claim 1 for emitting electrons;

a cooling device configured for cooling the electron source, wherein the electron source is fixed to the cooling device by an electrically insulating heat conductor;

a heating device configured for adjusting a temperature of the electron source; and a gas introduction device configured for introducing a hydrogen-containing gas.

* * * * *